United States Patent
Pandey et al.

(10) Patent No.: US 9,548,450 B2
(45) Date of Patent: Jan. 17, 2017

(54) DEVICES CONTAINING METAL CHALCOGENIDES

(71) Applicant: Micron Technology, Inc., Boise, ID (US)

(72) Inventors: Sumeet C. Pandey, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/807,030

(22) Filed: Jul. 23, 2015

(65) Prior Publication Data

US 2016/0087204 A1   Mar. 24, 2016

Related U.S. Application Data

(60) Provisional application No. 62/053,912, filed on Sep. 23, 2014.

(51) Int. Cl.
*H01L 47/00* (2006.01)
*H01L 45/00* (2006.01)

(52) U.S. Cl.
CPC .............. *H01L 45/147* (2013.01); *H01L 45/06* (2013.01); *H01L 45/141* (2013.01)

(58) Field of Classification Search
CPC ................... H01L 2924/0002; H01L 2924/00; H01L 45/1233; H01L 43/08; H01L 43/02; H01L 43/12; H01L 45/08; H01L 45/085; H01L 45/147; H01L 45/04; H01L 45/143; H01L 21/0337; H01L 45/142; H01L 45/144
See application file for complete search history.

(56) References Cited

U.S. PATENT DOCUMENTS

| | | |
|---|---|---|
| 2004/0114413 A1 | 6/2004 | Parkinson et al. |
| 2006/0102870 A1* | 5/2006 | Viens ................ H01L 27/14652 |
| | | 252/62.3 R |
| 2006/0126305 A1 | 6/2006 | Chen et al. |
| 2011/0017298 A1* | 1/2011 | Lee ..................... H01L 31/0725 |
| | | 136/261 |
| 2011/0165728 A1 | 7/2011 | Greeley et al. |
| | (Continued) | |

FOREIGN PATENT DOCUMENTS

| | | |
|---|---|---|
| TW | 201336128 | 9/2013 |
| WO | WO | 11/2015 |
| | PCT/US2015/044720 | |

*Primary Examiner* — Robert Bachner
(74) *Attorney, Agent, or Firm* — Wells St. John P.S.

(57) ABSTRACT

Some embodiments include a device having a conductive material, a metal chalcogenide-containing material, and a region between the metal chalcogenide-containing material and the conductive material. The region contains a composition having a bandgap of at least about 3.5 electronvolts and a dielectric constant within a range of from about 1.8 to 25. Some embodiments include a device having a first electrode, a second electrode, and a metal chalcogenide-containing material between the first and second electrodes. The device also includes an electric-field-modifying region between the metal chalcogenide-containing material and one of the first and second electrodes. The electric-field-modifying region contains a composition having a bandgap of at least about 3.5 electronvolts having a low dielectric constant and a low conduction band offset relative to a workfunction of metal of the metal chalcogenide-containing material.

9 Claims, 3 Drawing Sheets

(56) References Cited

U.S. PATENT DOCUMENTS

| | | |
|---|---|---|
| 2011/0194329 A1 | 8/2011 | Ohba et al. |
| 2011/0214725 A1* | 9/2011 | Beck .................. H01L 31/0322 136/255 |
| 2011/0305068 A1 | 12/2011 | Kitagawa et al. |
| 2012/0267632 A1 | 10/2012 | Ramaswamy et al. |
| 2012/0314479 A1* | 12/2012 | Mizuguchi .............. H01L 45/08 365/148 |

* cited by examiner

DEVICES CONTAINING METAL CHALCOGENIDES

RELATED PATENT DATA

This patent claims priority to U.S. Provisional Patent Application Ser. No. 62/053,912, which was filed Sep. 23, 2014, and which is hereby incorporated herein by reference.

TECHNICAL FIELD

Devices containing semiconducting chalcogenides having electrochemically-active metal ions.

BACKGROUND

Memory is often incorporated into integrated circuitry. The memory may be used, for example, in computer systems for storing data.

Memory may be fabricated as an array of individual memory cells, with each memory cell being configured to retain or store memory in at least two different selectable states. In a binary system, the storage conditions are considered as either a "0" or a "1".

One type of memory cell comprises two electrically conductive electrodes having a programmable material received between them, and may be suitable for utilization in cross-point array architecture. Cross-point array architecture allows for a three-dimensional multilayer stacking of densely-packed memories (i.e., more storage bits per $4F^2$ footprint). The memory cells in large cross-point arrays can be any of PCM, CBRAM, ReRAM/RRAM, or STT-RAM/STT-MRAM, etc.

A difficulty in utilizing cross-point memory is that there can be a substantial leakage of current through non-selected cells, and such may adversely lead to disturb, wasted power, and errors during writing and retrieval of stored data from a large memory array. Accordingly, diodes or other select devices are commonly paired with memory cells at each cross-point to assist in control of current through the memory cells, such as to reduce the leakage from any half- and un-selected cells.

Some aspects described below pertain to integrated devices suitable for utilization as select devices.

DETAILED DESCRIPTION OF THE ILLUSTRATED EMBODIMENTS

Some embodiments pertain to metal chalcogenide-containing devices suitable for utilization as select (i.e., access) devices in memory arrays. Example embodiment devices are described with reference to FIGS. 1-7.

Figure 1:
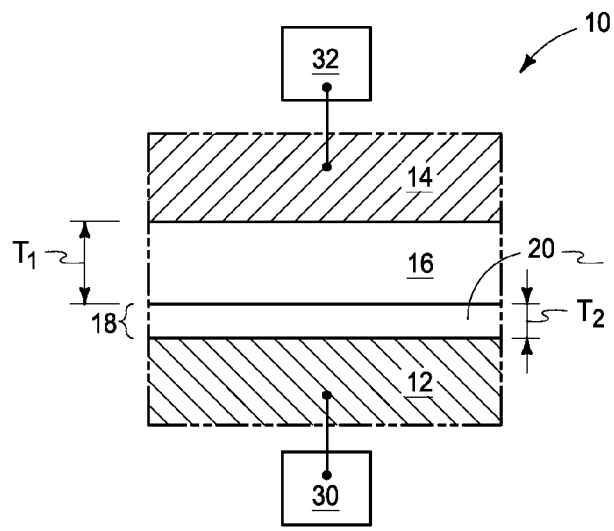
FIGS. 1 and 3-7 are diagrammatic cross-sectional views of example embodiment devices.

Referring to FIG. 1, a device 10 comprises a pair of electrodes 12 and 14, and comprises metal chalcogenide-containing material 16 between the electrodes.

The electrodes 12 and 14 may comprise any suitable electrically conductive composition or combination of compositions; and in some embodiments may comprise, consist essentially of, or consist of one or more of various metals (for example, tungsten, titanium, etc.), metal-containing compositions (for instance, metal nitride, metal carbide, metal silicide, etc.), and conductively-doped semiconductor materials (for instance, conductively-doped silicon, conductively-doped germanium, etc.). The electrodes 12 and 14 may comprise a same composition as one another, or may comprise different compositions relative to one another. In some embodiments, one of the electrodes may comprise, consist essentially of, or consist of titanium nitride; while the other comprises, consists essentially of, or consists of tungsten.

The metal chalcogenide-containing material 16 may comprise metal and one or more semiconductor materials. For instance, the material 16 may comprise copper in combination with one or both of germanium and selenium; may comprise silver in combination with one or both of germanium and selenium; etc. Compositions comprising metal and chalcogenide may be referred to herein as metal/chalcogenide.

The metal chalcogenide-containing material 16 may have any suitable thickness, and in some embodiments may have a thickness "$T_1$" of at least about 12 nanometers (nm). The thickness of the metal chalcogenide-containing material 16 may be kept relatively thin as compared to conventional devices in order to achieve rapid switching speed.

A region 18 is provided between electrode 12 and metal chalcogenide-containing material 16. The region 18 may be utilized to shift a threshold voltage ($V_t$) of the device 10 relative to a comparable device lacking the region 18. Such may enable device 10 to be tailored for specific applications. For instance, prior art devices have been constructed to comprise metal chalcogenide-containing material sandwiched between a pair of electrodes. Such devices may have too low $V_t$ to be suitable for utilization as select devices for memory arrays. It is difficult to increase $V_t$ of such devices without introducing complications that negatively affect performance of the devices. For instance, if metal/chalcogenide is exposed to too high of an electric field or potential drop, the metal ions may over-oxidize and threshold at lower voltages.

Utilization of the region 18 of the device 10 may enable the $V_t$ of device 10 to be increased relative to prior art devices without detrimentally increasing the electric field and potential drop across metal chalcogenide-containing material 16. Specifically, an electric field generated between electrodes 12 and 14 is spread across region 18 as well as metal chalcogenide-containing material 16. In a sense, the regions 16 and 18 may be thought of as adjacent capacitors sharing the electric field between electrodes 12 and 14. Accordingly, the electric field between electrodes 12 and 14 may be increased to correspond to a higher $V_t$ as compared to prior art devices, and yet the electric field and potential drop across metal chalcogenide-containing material 16 may remain at a voltage comparable to that of prior art devices. In some embodiments, region 18 may be referred to as an electric-field-modifying region.

The region 18 comprises a composition 20. The benefit derived from region 18 pertaining to the proportional support of the electric field between the electrodes increases with decreasing dielectric constant and increasing bandgap of composition 20; and in some embodiments composition 20 may have a bandgap of at least about 3.5 electronvolts. Higher band gap helps with the lower off-state leakage (wider voltage margins to keep the currents below 10 nA). The composition 20 may comprise any suitable substance, and in some embodiments may comprise one or more oxides. For instance, in some embodiments composition 20 may comprise one or both of the gallium oxide (bandgap 4.8 electronvolts, dielectric constant 4.2) and gadolinium oxide (bandgap 5.8 electronvolts, dielectric constant 4.8). Although a low dielectric constant composition 20 may be preferred, in some embodiments the dielectric constant of composition 20 may be within a range of from about 1.8 to about 25.

The composition 20 may comprise a metal-doped oxide in some embodiments. For instance, the composition 20 may comprise one or both of gallium oxide and gadolinium oxide doped with aluminum.

The composition 20 may have any suitable thickness "$T_2$" to optimize the voltage drop and electric fields in the metal-chalcogenide material such as to set the $V_t$ to be compatible with the memory element and the array size. In some embodiments, the composition may have a thickness ratio of 0.05 to 1 relative to the metal chalcogenide-containing material thickness. In some embodiments, the thickness $T_2$ may be within a range of from greater than 0 nm to less or equal to about 3 nm. In some embodiments, the composition 20 may have a thickness within a range of from about one monolayer to less than or equal to about 5 monolayers. If region 18 comprises only the single composition 20, then region 18 will have the same thickness as composition 20. In other embodiments, (such as, for example, embodiments described below with reference to FIGS. 4 and 5) region 18 may comprise multiple layers of differing composition. In some embodiments, region 18 may have a thickness outside of the ranges described above relative to composition 20.

Device 10 may have two operational states, with one of such states being an "off" state and the other being an "on" state. Current flow through the device is desired to be zero (or at least very low) in the "off" state, and is desired to be relatively high in the "on" state. A problem with some prior art devices is that current flow in the "on" state is not as high as desired. In some embodiments, region 20 comprises a composition that effectively couples with metal from metal/chalcogenide of material 16 to enable high current density through device 10 in the operational "on" state.

Figure 2:
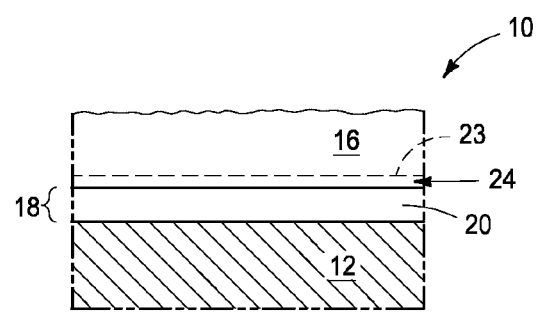
FIG. 2 is a diagrammatic cross-sectional view of a region of an example embodiment device shown at an operational "on" state.

FIG. 2 shows a region of device 10 in the operational "on" state. Metal from metal/chalcogenide 16 has migrated toward electrode 12 and created a metal-enriched region 24 adjacent composition 20. A dashed line 23 is utilized to diagrammatically illustrate an approximate boundary of the metal-enriched region. In practice, the metal-enriched region may or may not have a recognizable boundary within metal/chalcogenide 16.

In some embodiments, composition 20 may have a conduction band which is offset from the work function of the metal within metal-enriched region 24 by no more than about 1 electronvolt; or even by no more than about 0.5 electronvolt. For instance, if the metal of metal/chalcogenide is copper, the work function of the metal will be within a range of from about 4.5 electronvolts to about 4.9 electronvolts. In such embodiments, the composition 20 may have a bandgap within a range of from about 4.0 electronvolts to about 5.4 electronvolts so that the bandgap is offset from the work function of the metal by no more than about 0.5 electronvolts (i.e., is within 0.5 electronvolts of the workfunction), or may have a bandgap within a range of from about 3.5 electronvolts to about 5.9 electronvolts so that the bandgap is offset from the work function of the metal by no more than about 1 electronvolt. In particular embodiments, composition 20 may comprise one or both of the gallium oxide (bandgap 4.8 electronvolts) and gadolinium oxide (bandgap 5.8 electronvolts); and metal chalcogenide-containing material 16 may comprise copper/chalcogenide, with the copper having the work function of from about 4.5 electronvolts to about 4.9 electronvolts. It is noted that bands may have some variation depending on field strength, and accordingly the gadolinium oxide conduction band may be within 0.5 electronvolts of the workfunction of copper at appropriate field strengths.

Referring again to FIG. 1, the device 10 may be incorporated into any of numerous regions of integrated circuit architectures; such as, for example, logic and/or memory. It is shown to be electrically coupled to an integrated structure 30 through electrode 12, and to another integrated structure 32 through electrode 14. If device 10 is utilized in memory, the structures 30 and 32 may correspond to, for example, an access/sense line and a memory cell, respectively (or vice versa). The memory cell may be an RRAM cell, such as, for example, a phase change memory cell, conductive-bridging memory cell, multivalent oxide memory cell, spin-transfer torque memory cell, etc. The memory cell may be one of a vast number of memory cells of a memory array, and device 10 may be representative of a vast number of identical devices utilized as select devices within the memory array.

Figure 3:
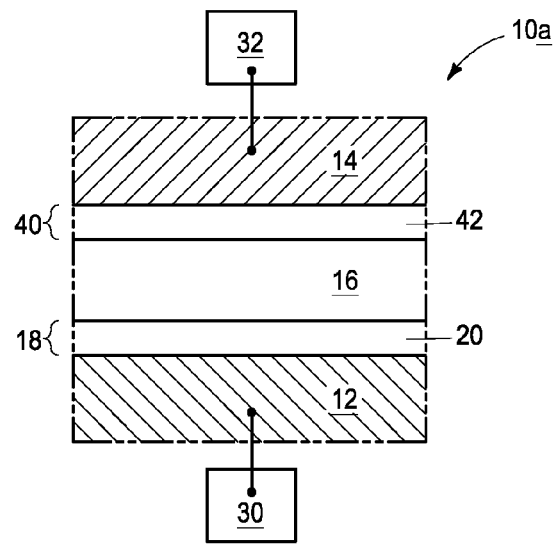

The device 10 of FIG. 1 is shown comprising a single electric-field-modifying region 18. In other embodiments, multiple electric-field-modifying regions may be utilized. For instance, FIG. 3 shows a device 10a comprising a second electric-field-modifying region 40 in addition to the first electric-field-modifying region 18. The second electric-field-modifying region 40 is on an opposite side of metal chalcogenide-containing material 16 relative to the first electric-field-modifying region 18.

The region 40 comprises a composition 42. Such composition may comprise any of the materials described above relative to the composition 20 of region 18. In some embodiments, composition 42 may be the same as composition 20, and in other embodiments may be different relative to composition 20.

Figure 4:
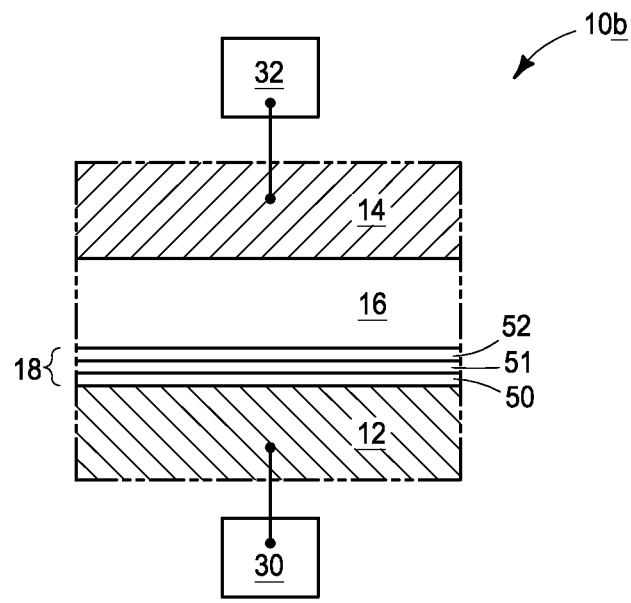

The region 18 of FIG. 1 is shown comprising a single composition 20. In other embodiments, the region 18 may comprise two or more layers of differing composition. For instance FIG. 4 shows a device 10b in which region 18 comprises a stack of three layers 50-52. In some embodiments, layers 50 and 52 may comprise one or both of gallium oxide and gadolinium oxide; and layer 51 may comprise aluminum oxide. The layers 50 and 52 may be the same composition as one another, or may be different compositions relative to one another. The utilization of multiple layers in region 18 may enable the overall dielectric properties of the region, and/or other properties of the region, to be tailored for particular applications.

Although the region 18 of FIG. 4 is shown comprising three layers, in other embodiments the region may comprise less than three layers or more than three layers.

Figure 5:
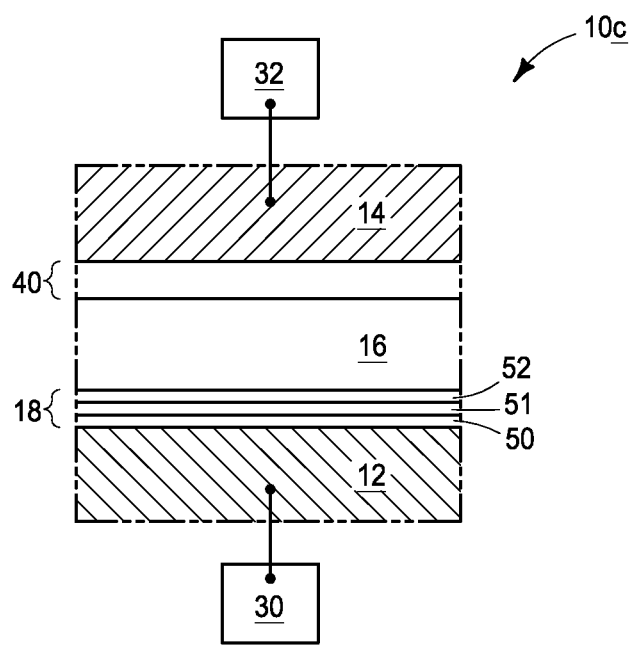

The embodiment of FIG. 4 shows a device containing only one electric-field-modifying region. In other embodiments, the device may comprise multiple electric-field-modifying regions. For instance, FIG. 5 shows the multilayer electric-field-modifying region 18 utilized in combination with a region 40 analogous to that described above with reference to FIG. 3. The region 40 may comprise a single composition (for instance, the composition 42 of FIG. 3) or may comprise multiple layers of differing compositions (for instance, layers 50-52 of the type described above with reference to region 18).

Figure 6:
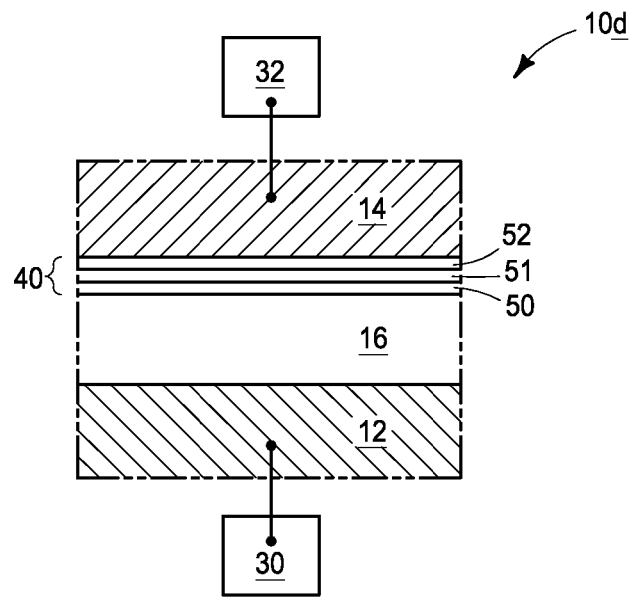
Figure 7:
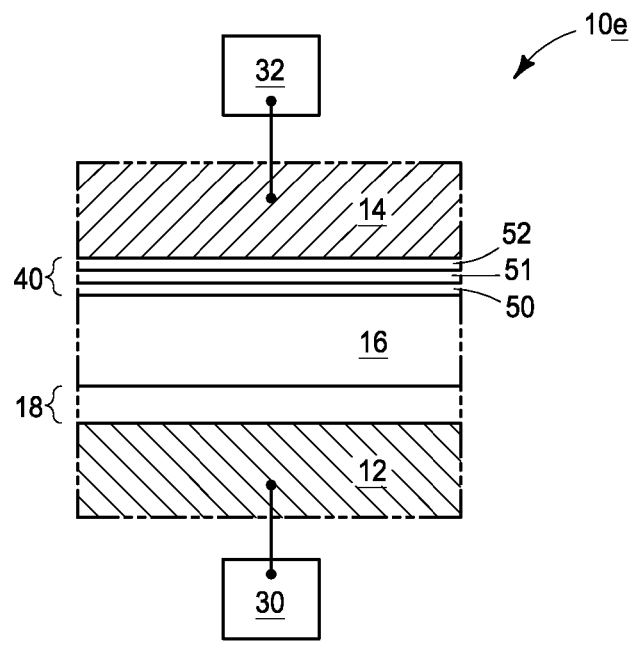

Embodiments analogous to FIGS. 4 and 5 may be formed with top region 40 comprising multilayer material. Examples of such embodiments are shown in FIGS. 6 and 7.

In some embodiments, the devices of FIGS. 1 and 3-7 may be bipolar devices in that they may enable current flow in a direction from bottom electrode 12 to top electrode 14, or may enable current flow in the opposite direction. Bipolar devices may be advantageous in some applications due to bidirectional operation being desired for RRAM, CBRAM and STT-RAM in some applications.

In some embodiments, the composition 42 of FIG. 3 matches the composition 20 of FIG. 3, and the device 10a of FIG. 3 may be referred to as a symmetric device in that there is a mirror plane of symmetry along the center of metal chalcogenide-containing region 16. In contrast, the devices of FIGS. 1, 4 and 6 are asymmetric devices. The devices of FIGS. 5 and 7 may be symmetric devices or asymmetric devices depending on the relative compositions of regions 18 and 40. Also, in some embodiments the device of FIG. 3 may be an asymmetric device if composition 42 does not match composition 20 and/or if region 40 is formed to be of a different thickness than region 18. The various symmetric and asymmetric configurations of the embodiments described herein may enable devices to be tailored for particular applications.

The devices and arrangements discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "electrically insulative" may both utilized to describe materials having insulative electrical properties. Both terms are considered synonymous in this disclosure. The utilization of the term "dielectric" in some instances, and the term "electrically insulative" in other instances, may be utilized to provide language variation within this disclosure to simplify antecedent basis, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A device, comprising:
a first electrode, a second electrode, and a metal chalcogenide-containing material between the first and second electrodes;
an electric-field-modifying region between the metal chalcogenide-containing material and one of the first and second electrodes, the region comprising at least one composition having a bandgap of at least about 3.5 electronvolts; and
wherein the region is a first region and is between the first electrode and the metal chalcogenide-containing material, and further comprising a second region between the metal chalcogenide-containing material and the second electrode with the second region also comprising a composition having a bandgap of at least about 3.5 electronvolts.

2. The device of claim 1 wherein the first and second regions comprise a same composition as one another.

3. The device of claim 1 wherein the first and second regions comprise different compositions relative to one another.

4. A device, comprising:
a first electrode, a second electrode, and a metal chalcogenide-containing material between the first and second electrodes;
an electric-field-modifying region between the metal chalcogenide-containing material and one of the first and second electrodes; the electric-field-modifying region comprising a stack of at least three layers; and
wherein the layers comprise a first layer, a second layer and a third layer; with the first and third layers comprising one or both of gallium oxide and gadolinium oxide, and with the second layer comprising aluminum oxide.

5. The device of claim 4 wherein the first and third layers are a same composition as one another.

6. The device of claim 4 wherein the first and third layers are different compositions relative to one another.

7. A device, comprising:
a first electrode, a second electrode, and a metal chalcogenide-containing material between the first and second electrodes;
an electric-field-modifying region between the metal chalcogenide-containing material and one of the first and second electrodes; the electric-field-modifying region comprising a stack of at least two layers; and
wherein the electric-field-modifying region is first electric-field-modifying region and is between the first electrode and the metal chalcogenide-containing material, and further comprising a second electric-field-modifying region between the second electrode and the chalcogenide.

8. The device of claim 7 wherein the second electric-field-modifying region is identical in composition to the first electric-field-modifying region.

9. The device of claim 7 wherein the second electric-field-modifying region is different in composition from the first electric-field-modifying region.

* * * * *